(12) United States Patent
Hwang et al.

(10) Patent No.: US 8,541,079 B2
(45) Date of Patent: Sep. 24, 2013

(54) INJECTION-MOLDED PRODUCT WITH PERMEABILITY

(75) Inventors: Yong-Wook Hwang, Gyeonggi-do (KR); Hyon-Myong Song, Gyeonggi-do (KR); Jong-Woo Kim, Gyeonggi-do (KR); Young-Ki Kim, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 207 days.

(21) Appl. No.: 12/856,866

(22) Filed: Aug. 16, 2010

(65) Prior Publication Data
US 2011/0081513 A1    Apr. 7, 2011

(30) Foreign Application Priority Data

Oct. 5, 2009  (KR) .......................... 10-2009-0094406

(51) Int. Cl.
*B32B 27/08*    (2006.01)
(52) U.S. Cl.
USPC ............. 428/35.7; 428/38; 428/34.1; 403/24

(58) Field of Classification Search
USPC .......... 428/34.1, 35.7, 38; 403/24; 264/1.31, 264/1.34, 255, 249; 206/316.1, 702–728
See application file for complete search history.

(56) References Cited

U.S. PATENT DOCUMENTS 5,131,778 A * 7/1992 Asai et al. ........................ 403/24

FOREIGN PATENT DOCUMENTS

KR    10-2010-0107973    10/2010

* cited by examiner

*Primary Examiner* — Ellen S Raudenbush
*Assistant Examiner* — Yan Lan
(74) *Attorney, Agent, or Firm* — Cha & Reiter, LLC

(57) ABSTRACT

Provided is an injection-molded product manufactured of a synthetic resin having light permeability, the injection-molded product including a pattern structure formed on an inner surface of the injection-molded product and a coupling structure formed on the pattern structure, in which the coupling structure is hidden by the pattern structure from an outer surface of the injection-molded product. The injection-molded product may be manufactured of a transparent material so that the coupling structure or reinforcing structure, can be hidden visually. Various colors can be used in the surface treatment, such as painting or deposition, on the injection-molded product.

13 Claims, 4 Drawing Sheets

111a

111b

111c

111d

INJECTION-MOLDED PRODUCT WITH PERMEABILITY

CLAIM OF PRIORITY

This application claims the benefit under 35 U.S.C. §119(a) of a Korean Patent Application filed in the Korean Intellectual Property Office on Oct. 5, 2009 and assigned Serial No. 2009-94406, the entire disclosure of which is hereby incorporated by reference.

BACKGROUND OF THE INVENTION

1. Field of the Invention

The present invention relates to an injection-molded product manufactured with synthetic resin materials, and more particularly, to an injection-molded product having light permeability.

2. Description of the Related Art

Generally, an injection-molded product has a predetermined shape, which is manufactured by melting synthetic resin, injecting the melt synthetic resin into a molding die, and then curing it. Most products manufactured using synthetic resin manufactured by injection molding are in daily use, including kitchen utensils, bathroom articles, home appliances, cellular phones, and vehicle interior materials, Recently, various portable electronic devices such as cellular phones, MP3 players, portable multimedia players, portable game consoles, etc. have come into wide use, outer cases are typically made of injection-molded products. Users of portable electronics regard their portable electronic devices as fashion items like accessories. Thus, manufacturers of the portable electronic devices are putting efforts to sophisticate and diversify the design.

The electronic devices, by their nature, are costly in research, development and manufacturing stages prior to becoming actual products. Although electronic devices are typically made with metallic cases and have to overcome problems such as an electric leakage, electromagnetic interference, and so forth.

The electric leakage or electromagnetic interference is alleviated by mainly using injection-molded products as cases of portable electronic devices. For sophisticated exteriors, a surface treatment is performed using painting, deposition, printing, and plating. Alternatively, a film having a color or pattern on a surface thereof is put into a molding die in advance such that film coating is performed simultaneously with molding (film insert injection molding). However, portable electronic devices, because of being carried and frequently manipulated by a user, are likely to be exposed to an external environment, thus being prone to a scratch as a result of drop or mishandling. As a result, the case manufactured with surface treatment or film insert injection molding may easily experience damages to its color or pattern. Moreover, there is a limitation in forming a 3D color or pattern on the case surface.

In recent times, injection-molded products having light permeability have been used to manufacture the cases of the portable electronic devices. In case of the light-permeability injection-molded product, a color or pattern, even when being formed on an inner surface of the product, can be seen from outside, so that the color or decorative pattern is not deteriorated by damage, such as a fall or scratch, to an outer surface of the product. However, since the case of the electronic device can be a complete case only by coupling between an injection-molded product and a counterpart injection-molded product, a hook for coupling with the counterpart or a boss for screw engagement has to be formed. However, there is a drawback in that the injection-molded product having permeability with such coupling structures are visible from outside.

In manufacturing permeable injection-molded products, when colors or patterns are formed on an inner surface, painting or deposition should be performed with dark colors to prevent internal coupling structures from being visible from outside. In spite of surface treatment, such as painting or deposition, on the inner surface with dark colors, the coupling structures on the inner surface of the injection-molded product cannot be completely hidden.

An inner surface 10a of a permeable injection-molded product 10, which has red-type paints deposited thereon, is shown in FIG. 1, and an outer surface of the injection-molded product 10 is shown in FIG. 2. As shown in FIGS. 1 and 2, on the inner surface 10a of the injection-molded product 10 are formed coupling structures 11 and 13 and a reinforcement structure 15 for reinforcing rigidity. To hide the internal coupling structures 11 and 13, such surface treatment as painting or deposition is performed on the inner surface 10a of the injection-molded product 10, whereby the injection-molded product 10 looks reddish from outside. However, as can be seen in FIGS. 1 and 2, only with the surface treatment, the coupling structures 11 and 13 or the reinforcing structure 15 cannot be completely hidden from the outer surface of the injection-molded product 10.

Therefore, there is a need to enhance visual and design features, in manufacturing a case with a permeable injection-molded product, so that coupling structures can be entirely hidden to provide an elegant exterior casing for fashion conscious portable users.

SUMMARY OF THE INVENTION

An aspect of the present invention is to address at least the above problems and/or disadvantages and to provide at least the advantages described below. Accordingly, an aspect of the present invention is to provide an injection-molded product which allows an exterior of a case of a portable electronic device to be elegant. Another aspect of the present invention is to provide an injection-molded product which prevents a color or pattern of a case from being directly damaged due to a dropping or scratching, while maintaining an exterior of the case from scratch free.

According to another aspect of the present invention, there is provided an injection-molded product manufactured of synthetic resin having light permeability, the injection-molded product including a pattern structure formed on an inner surface of the injection-molded product and a coupling structure formed on the pattern structure, in which the coupling structure is hidden by the pattern structure from an outer surface of the injection-molded product.

The coupling structure formed in the injection-molded product and the coupling structure formed in a second injection-molded product are coupled to each other face-to-face such that the injection-molded product is coupled and fixed to the second injection-molded product, the second injection-molded product including the pattern structure and the coupling structure.

The pattern structure may be in a shape of a band in which protruding portions and recessed portions are alternately formed in succession, the pattern structure may be formed such that protruding portions and recessed portions are alternately formed on the entire inner surface of the injection-molded product, or the pattern structure may be formed of lattice patterns which consecutively protrude at least in adjacent to an edge of the inner surface of the injection-molded product.

BRIEF DESCRIPTION OF THE DRAWINGS

The above and other features and advantages of an exemplary embodiment of the present invention will be more apparent from the following detailed description taken in conjunction with the accompanying drawings, in which.

DETAILED DESCRIPTION OF THE INVENTION

Hereinafter, an exemplary embodiment of the present invention will be described in detail with reference to the accompanying drawings. For the purposes of simplicity and avoid redundancy, detailed descriptions of well-known functions and constructions are omitted for clarity and conciseness.

Figure 1:
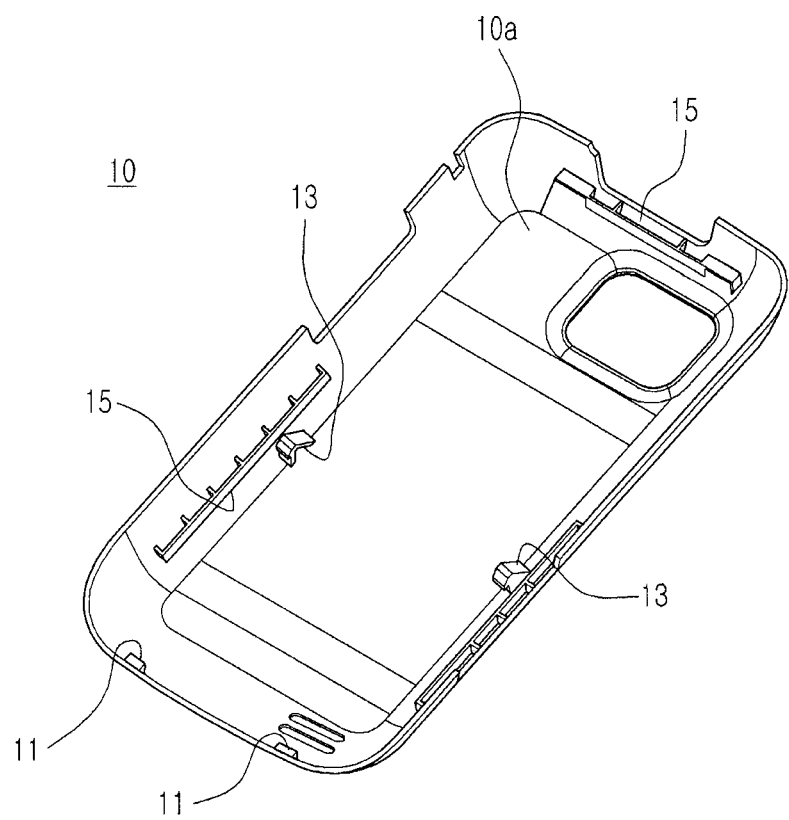
FIG. 1 is a perspective view of an injection-molded product according to an embodiment of the prior art.
Figure 2:
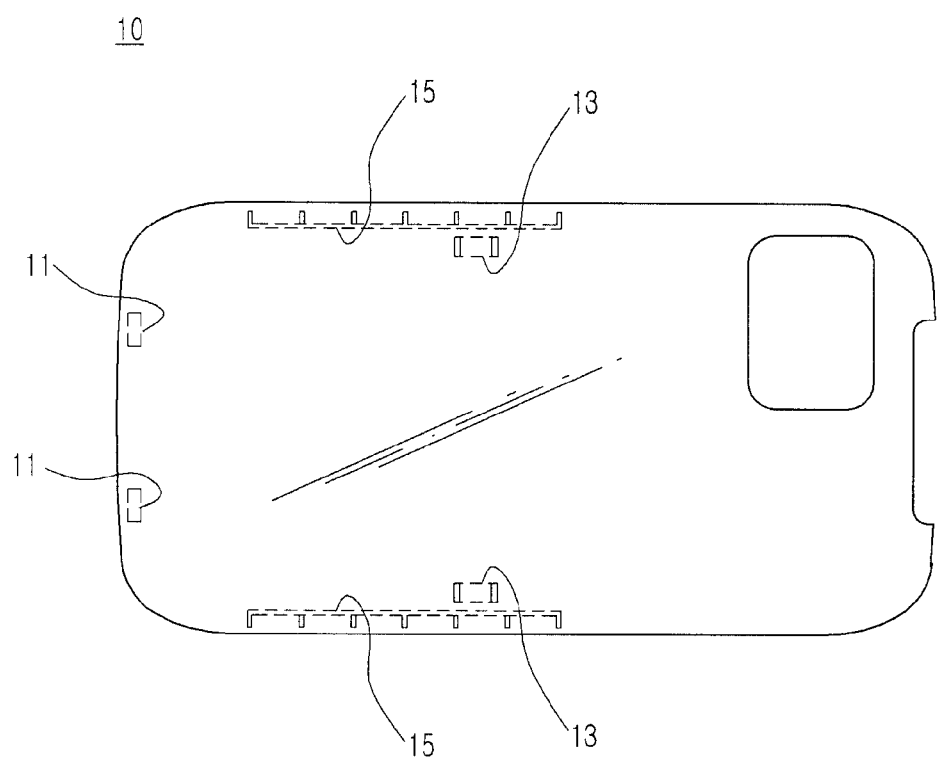
FIG. 2 is a perspective view of the injection-molded product shown in FIG. 1, when viewed from outside.
Figure 3:
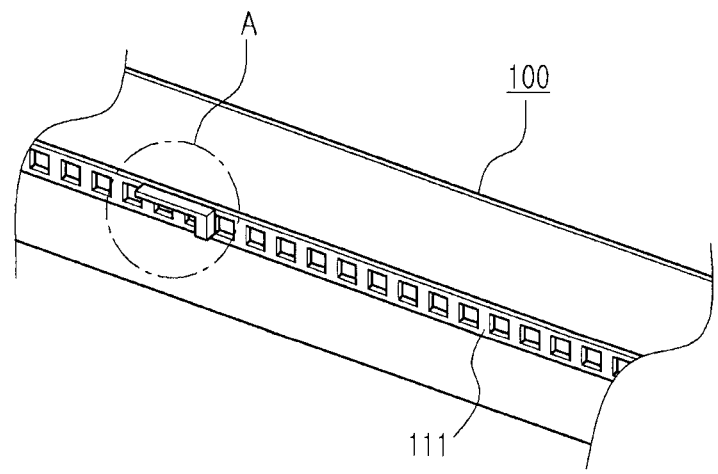
FIG. 3 is a perspective view of a main part of an injection-molded product according to an embodiment of the present invention.
Figure 4:
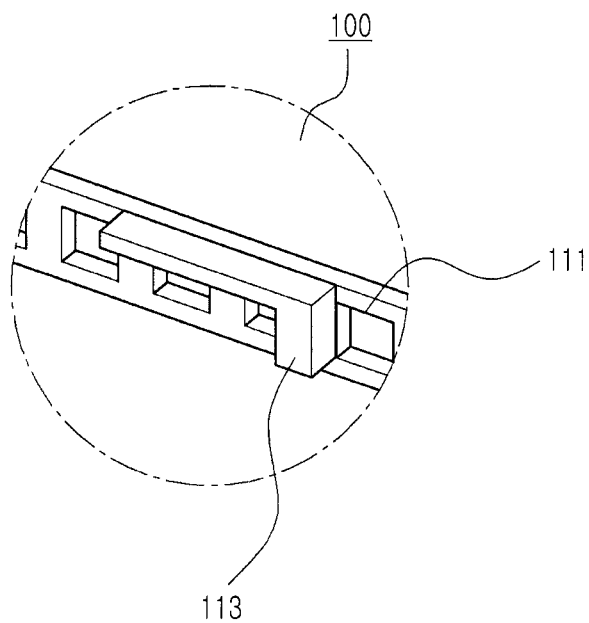
FIG. 4 is an enlarged perspective view of a portion of the injection-molded product shown in FIG. 3.
Figure 5A:
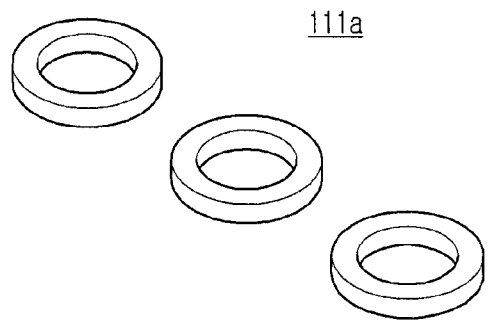
FIGS. 5A through 5D show various shapes of pattern structures formed in the injection-molded product shown in FIG. 3.
Figure 5B:
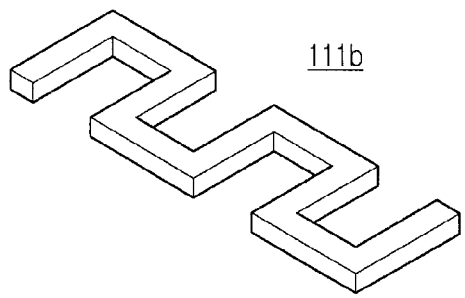
Figure 5C:
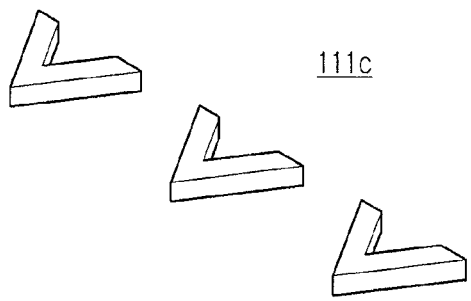
Figure 5D:
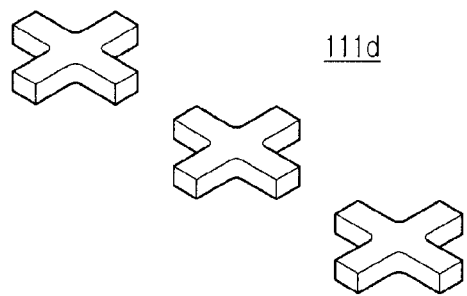

Referring to FIGS. 3 and 4, an injection-molded product 100 according to an exemplary embodiment of the present invention includes a pattern structure 111 integrally formed on an inner surface thereof and a coupling structure 113 formed on the pattern structure 111.

The pattern structure 111 is in the shape of a band in which protruding portions and recessed portions are alternately formed in succession, and preferably extends along and in adjacent to the edge of an inner surface of the injection-molded product 100, so that the coupling structure 113, usually formed in adjacent to the edge of the inner surface of the injection-molded product 100, can be hidden. Since the pattern structure 111, which hides the coupling structure 113, is visible from an outer surface of the injection-molded product 100, it may be formed on the entire inner surface of the injection-molded product 100.

Referring to FIGS. 5A to 5D, the pattern structure 111 in the band shape may be formed of various shapes such as an alphabet 'O' shape 111a, a zigzag shape 111b, an alphabet 'V' shape 111c, and a '+' FIG. 111d, or the pattern structure 111 may be formed using lattice patterns at least in adjacent to the edge of the inner surface of the injection-molded product 100. The pattern structure 111 having repetitions of the same pattern may be formed on the entire inner surface of the injection-molded production 100, or a figuration of a natural object, such as a tree or wave, or a symbol of a manufacturer or other desired symbol may be formed as the pattern structure 111.

The coupling structure 113 is in the shape of a hook and provides a means for coupling the injection-molded product 100 with another second injection-molded product (not shown). The second injection-molded product may also include the pattern structure 111 and the coupling structure 113. The injection-molded product 100 and the second injection-molded product are coupled with each other through connection between their coupling structures 113, thereby constituting a complete case.

Although the coupling structure 113 is described as the hook-shape structure above, it may also be a protrusion formed by double-injecting a metallic engagement element for a screw coupling onto the inner surface of the injection-molded product 100.

Even though the coupling structure 113 is formed in the injection-molded product 100 manufactured of transparent synthetic resin, it is hidden by the pattern structure 111, thus being invisible from outside.

Therefore, the transparent injection-molded product 100 itself can be used as a case of a portable electronic device. Through such surface treatment as painting or deposition on the inner surface of the injection-molded product 100, a color or pattern can be prevented from being directly damaged in spite of damage to the outer surface of the injection-molded product 100 due to a fall or scratch. The coupling structure 113, which may visually deteriorate the exterior, is already hidden by the pattern structure 111 prior to the surface treatment, so that various colors of cases can be manufactured with a relaxed limitation in color selection during the surface treatment on the inner surface of the injection-molded product 100.

As described above, the injection-molded product is manufactured of a transparent material and the coupling structure formed for coupling with a counterpart injection-molded product is prevented from being exposed to outside by the pattern structure. Therefore, the coupling structure or reinforcing structure, which may visually deteriorate the exterior, can be hidden, thereby allowing the exterior of the portable electronic device to look elegant. Moreover, the pattern structure may have design such as various lattice patterns or manufacturers' symbols, contributing to improvement of portable electronic device design. Furthermore, even though the injection-molded product is manufactured of a transparent material, the coupling structure, which visually deteriorates the exterior, can be hidden, whereby various colors can be used in surface treatment, such as painting or deposition, on the injection-molded product.

While the present invention has been shown and described with reference to an embodiment thereof, it will be understood by those skilled in the art that various changes in form and details may be made therein without departing from the spirit and scope of the invention as defined by the appended claims.

For example, although the pattern structure and the coupling structure are separately formed in the exemplary embodiment of the present invention by way of example, the coupling structure itself may constitute the pattern structure. That is, the coupling structure in a shape shown in FIG. 4, i.e., the '¬' shape pattern may be consecutively formed on the inner surface of the injection-molded product 100, thereby forming the pattern structure. In this case, when the injection-molded product 100 is coupled with its counterpart injection-molded product, its coupling structure to be actually connected with that of the counterpart injection-molded product is in the same shape as the other coupling structures forming the pattern structure, so that the coupling structures forming the pattern structure are indistinguishable when viewed from outside. However, it can be easily understood by those of ordinary skill in the art that the coupling structure actually used for coupling with the counterpart injection-molded product would protrude by a larger amount than the other coupling structures forming the pattern structure.

What is claimed is:

1. An injection-molded product manufactured of a synthetic resin having light permeability, comprising:
   a pattern structure formed on an inner surface of the injection-molded product, and having protruding portions and recessed portions forming a pattern visible on an outer surface of the injection-molded product; and
   a coupling structure formed on one or more protruding portions of the pattern structure and extending substantially perpendicular from an adjoining surface of the pattern structure, said coupling structure extending along said one or more protruding portions of the adjoining surface of the pattern structure without covering any recessed portions of the pattern structure,
   wherein the coupling structure having a width and a length that is less than a width and a length of the adjoining surface of the pattern structure, and wherein the coupling structure is formed within an area defined by the adjoining surface of the pattern structure along the inner surface of the injection molded product to block visibility of the coupling structure from the outer surface of the injection-molded product.

2. The injection-molded product of claim 1, wherein the coupling structure formed in the injection-molded product and the coupling structure formed in a second injection-molded product are connected to each other face-to-face such that the injection-molded product is coupled and fixed to the second injection-molded product, the second injection-molded product comprising the pattern structure and the coupling structure.

3. The injection-molded product of claim 1, wherein the pattern structure is in a shape of a band in which the protruding portions and the recessed portions are alternately formed in succession.

4. The injection-molded product of claim 1, wherein the pattern structure is formed such that the protruding portions and the recessed portions are alternately formed on the entire inner surface of the injection-molded product.

5. The injection-molded product of claim 1, wherein the pattern structure is formed of lattice patterns which consecutively protrude at least adjacent to an edge of the inner surface of the injection-molded product.

6. The injection-molded product of claim 1, wherein the pattern structure is in a shape in which the coupling structure is consecutively formed.

7. The injection-molded product of claim 1, wherein each of the recesses has a predetermined shape which is one of an O shape, a zigzag shape, a V shape, and a + shape.

8. A device for enclosing components of a portable electronic device, comprising:
   a first case and a second case,
   wherein each of the first and second cases includes:
   a pattern structure formed on an inner surface of the respective case, and having protruding portions and recessed portions forming a pattern visible on an outer surface of the respective case; and
   a coupling structure formed on one or more protruding portions of the pattern structure and extending substantially perpendicular from an adjoining surface of the pattern structure, said coupling structure extending along said one or more protruding portions of the adjoining surface of the pattern structure via an injection molding process without covering any recessed portions of the pattern structure, wherein the coupling structure having a width and a length that is less than a width and a length of the adjoining surface of the pattern structure, and wherein the coupling structure is formed within an area defined by adjoining surface of the pattern structure along the inner surface of the injection molded product to block visibility of, the coupling structure from the outer surface of the injection-molded product; and
   wherein the first case and the second case interlocks to each other via the respective coupling structures.

9. The device of claim 8, wherein the pattern structure is in a shape of a band in which the protruding portions and the recessed portions are alternately formed in succession.

10. The device of claim 8, wherein the pattern structure is formed such that the protruding portions and the recessed portions are alternately formed on the entire inner surface therein.

11. The device of claim 8, wherein the pattern structure is formed of lattice patterns which consecutively protrude at least adjacent to an edge of the inner surface therein.

12. The device of claim 8, wherein the pattern structure is in a shape in which the coupling structure is consecutively formed.

13. The device of claim 8, wherein each of the recesses has a predetermined shape which is one of an O shape, a zigzag shape, a V shape, and a + shape.

* * * * *